(12) United States Patent
Sarferaz

(10) Patent No.: US 11,507,884 B2
(45) Date of Patent: Nov. 22, 2022

(54) EMBEDDED MACHINE LEARNING

(71) Applicant: SAP SE, Walldorf (DE)

(72) Inventor: Siar Sarferaz, Heidelberg (DE)

(73) Assignee: SAP SE, Walldorf (DE)

( * ) Notice: Subject to any disclaimer, the term of this patent is extended or adjusted under 35 U.S.C. 154(b) by 507 days.

(21) Appl. No.: 16/735,089

(22) Filed: Jan. 6, 2020

(65) Prior Publication Data
US 2021/0209501 A1 Jul. 8, 2021

(51) Int. Cl.
| | |
|---|---|
| G06F 9/00 | (2006.01) |
| G06N 20/00 | (2019.01) |
| G06K 9/62 | (2022.01) |
| G06F 9/54 | (2006.01) |
| G06F 16/242 | (2019.01) |
| G06F 30/27 | (2020.01) |

(52) U.S. Cl.
CPC ........... *G06N 20/00* (2019.01); *G06F 9/54* (2013.01); *G06F 16/2445* (2019.01); *G06F 30/27* (2020.01); *G06K 9/6256* (2013.01)

(58) Field of Classification Search
None
See application file for complete search history.

(56) References Cited

U.S. PATENT DOCUMENTS

| | | | | |
|---|---|---|---|---|
| 2015/0379429 | A1* | 12/2015 | Lee | G09B 5/00 706/11 |
| 2016/0092786 | A1* | 3/2016 | Mehanna | G06N 20/00 706/11 |
| 2017/0185242 | A1* | 6/2017 | Jann | H04L 65/403 |
| 2017/0329466 | A1* | 11/2017 | Krenkler | G06F 9/453 |
| 2018/0285777 | A1* | 10/2018 | Li | H04L 67/535 |
| 2019/0073293 | A1* | 3/2019 | Sharma | G06F 16/22 |
| 2019/0156216 | A1* | 5/2019 | Gupta | G06N 20/00 |
| 2019/0188251 | A1* | 6/2019 | Liu | G06F 40/274 |
| 2019/0325333 | A1* | 10/2019 | Chan | G06N 20/00 |

* cited by examiner

*Primary Examiner* — Martin Mushambo
(74) *Attorney, Agent, or Firm* — Schwegman Lundberg & Woessner, P.A.

(57) ABSTRACT

Systems and methods are provided for receiving a request for data associated with a particular functionality of an application, identifying a first attribute for which data is to be generated to fulfill the request, and determining that the first attribute corresponds to data to be generated by a first machine learning model. The systems and methods further providing for executing a view or procedure to generate data for input to the first machine learning model, inputting the generated data into the first machine learning model, and receiving output from the first machine learning model. The output is provided in response to the request for data associated with the particular functionality of the application.

20 Claims, 13 Drawing Sheets

600

```
CLASS cl_hemi_template_rdt DEFINITION
    PUBLIC
    INHERITING FROM cl_hemi_model_mgmt_rdt_base
    FINAL
    CREATE PUBLIC .
    PUBLIC SECTION.
        INTERFACES if_hemi_model_management
        TYPE:
* Data structure of Random Decision Trees' prediction data
* <<<<<< TODO: next line: application specific dataset fields
            ts_rdt_predict_data TYPE shemi_exampledat_predict_data." can be enhanced by customer
        TYPES:
            tt_rdt_predict_data TYPE STANDARD TABLE OF ts_rdt_predict_data WITH DEFAULT KEY.
        TYPES:
* Data structure to contain the prediction result
* First four fields mandt, carrid, connid, fldate are key fields
* score and confidence are result of prediction
            BEGIN OF ts_rdt_predict_result,
* <<<<<< TODO: Starting point of adaptation: application specific key fields
            mandt           TYPE shemi_exampledat-mandt,
            carrid          TYPE shemi_exampledat-carrid,
            connid          TYPE shemi_exampledat-connid,
            fldate          TYPE shemi_exampledat-fldate,
            score           TYPE shemi_exampledat-planetype,
* <<<<<< TODO: End point of adaptation: application specific key fields
            confidence TYPE float,
        END OF ts_rdt_predict_result. "cannot be enhanced by customer, key fields are fix
    TYPES:
        tt_rdt_predict_result TYPE STANDARD TABLE OF ts_rdt_predict_result,
* <<<<<< TODO: End point of adaptation: application specific key fields
            confidence TYPE float,
        END OF ts_rdt_predict_result. " cannot be enhanced by customer, key fields are fix
    TYPES:
        tt_rdt_predict_result TYPE STANDARD TABLE OF ts_rdt_predict_result,
* <<<<<< TODO: next line: training data
        ttt_training_data     TYPE STANDARD TABLE OF shemi_exampledat WITH DEFAULT KEY.
```

```
702— CLASS-METHODS training
           AMDP OPTIONS READ-ONLY
       IMPORTING
           VALUE(it_data)                TYPE cl_hemi_template_rdt=>tt_training_data
           VALUE(it_param)               TYPE if_hemi_model_management=>tt_pal_param
       EXPORTING
           VALUE(et_model)               TYPE cl_hemi_model_mgmt_rdt_base=>tt_model
           VALUE(et_variable_importance) TYPE shemi_rdt_variable_imprtance
           VALUE(et_error_rate)          TYPE cl)hemi_model_mgmt_rdt_base=>tt_out_of_bag_error
           VALUE(et_confusion_matrix)    TYPE shemi_rdt_confusion_matrix_t
       RAISING
           cx_amdp_execution_failed .
704— CLASS-METHODS predict_with_model_version
           AMDP OPTIONS READ-ONLY
       IMPORTING
           VALUE(it_data)      TYPE cl_hemi_template_rdt=>tt_rdt_predict_data
           VALUE(it_model)     TYPE cl_hemi_model_mgmt_rdt_base=>tt_model
           VALUE(it_param)     TYPE if_hemi_model_management=>tt_pal_param
       EXPORTING
           VALUE(et_result)    TYPE id_hemi_model_template_rdt=>tt_rdt_predict_result
       RAISING
           cx_amdp_execution_failed .
```

```
CALSS cl_hemi_template_rdt IMPLEMENTATION.
  METHOD apply
         BY DATABASE PRACEDURE FOR HDB LANGUAGE SQLSCRIPT OPTIONS SUPPRESS SYNTAX ERRORS READ-ONLY
         USING badi_hemi_template_rdt=> predict_with_model_version.'
         /* <<<<<< todo: exchange BADI_HEMI_TEMPLATE_RDT */
    CALL "BADI_HEMI_TEMPLATE_RDT=>PREDICT_WITH_MODEL_VERSION" (
            it_data     =>      :it:data,
            it_model    =>      :it_model,
            it_param    =>      :it_param,
            et_result   =>      :et_result
     );
  ENDMETHOD.
  METHOD if_hemi_model_management~get_amdp_lass_name.
* <<<<<< todo: exchange BADI_HEMI_TEMPLATE_RDT
          DATA    lr_badi TYPE REF TO badi_hemi_template_rdt.
          TRY.
                  GET BADI lr_badi.
                  ev_name = cl-abap_classdescr=>get_class_name(lr_badi ->imp).
          CATCH cx_badi_context_error.
          CATCH cx_badi_not_implemented.
      ENDTRY.
    ENDMETHOD.
    METHOD if_hemi_model_management~get_meta_data.
* <<<<<< todo: exchange BADI_HEMI_TEMPLATE2_RDT
          DATA lr_badi TYPE REF TO badi_hemi_template2_rdt.             TRY.
                  GET BADI lr_badi.
                  CATCH cx_badi_context_error.
                  CATCH cx_badi_not_implemented.
              ENDTRY.       CALL BADI lr_badi->get_meta_data
                  IMPORTING
                      es_meta_data = es_meta_data.*<<<<<< todo: exchange datasets for training and prediction, exchange target field
            es_meta_data-training_data_set = 'SHEMI_EXAMPLEDAT'.
            es_meta_data-apply_data_set = 'SHEMI_EXAMPLEDAT_PREDICT_DATA'.
            es_meta_data-field_descriptions = VALUE #( (name = "PLANETYPE' role = cl_hemi_constants=>cs_fields_role-target) ).
ENDMETHOD.
METHOD training
        BY DATABASE PROCEDURE FOR HDB LANGUAGE SQLSCRIPT OPTIONS SUPPRESS SYNTAX ERRORS READ-ONLY
USING badi_hemi_template_rdt=>training.
/* <<<<<< todo: exchange BADI_HEMI_TEMPLATE_RDT */        CALL "BADI_HEMI_TEMPLATE_RDT=>TRAINING" (
It_data              => :it_data,
It_param             => :it_param,
et_model             => :et_model,
et_variable_importance => :et_variable_importance,
et_error_rate        => :et_error_rate,
et_confusion_matrix  => :et_confusion_matrix
);
ENDMETHOD.
ENDCLASS.
```

FIG. 8

EMBEDDED MACHINE LEARNING

BACKGROUND

Machine learning is a type of artificial intelligence that provides computing systems the ability to automatically learn and improve experience without being explicitly programmed. For example, machine learning comprises algorithms that computer systems use to perform specific tasks by determining patterns and inference, instead of by using explicit instructions. Some example tasks include image processing, prediction, classification, and so forth.

BRIEF DESCRIPTION OF THE DRAWINGS

Various ones of the appended drawings merely illustrate example embodiments of the present disclosure and should not be considered as limiting its scope.

FIGS. 6-8 illustrate example templates, according to some example embodiments.

DETAILED DESCRIPTION

Figure 1:
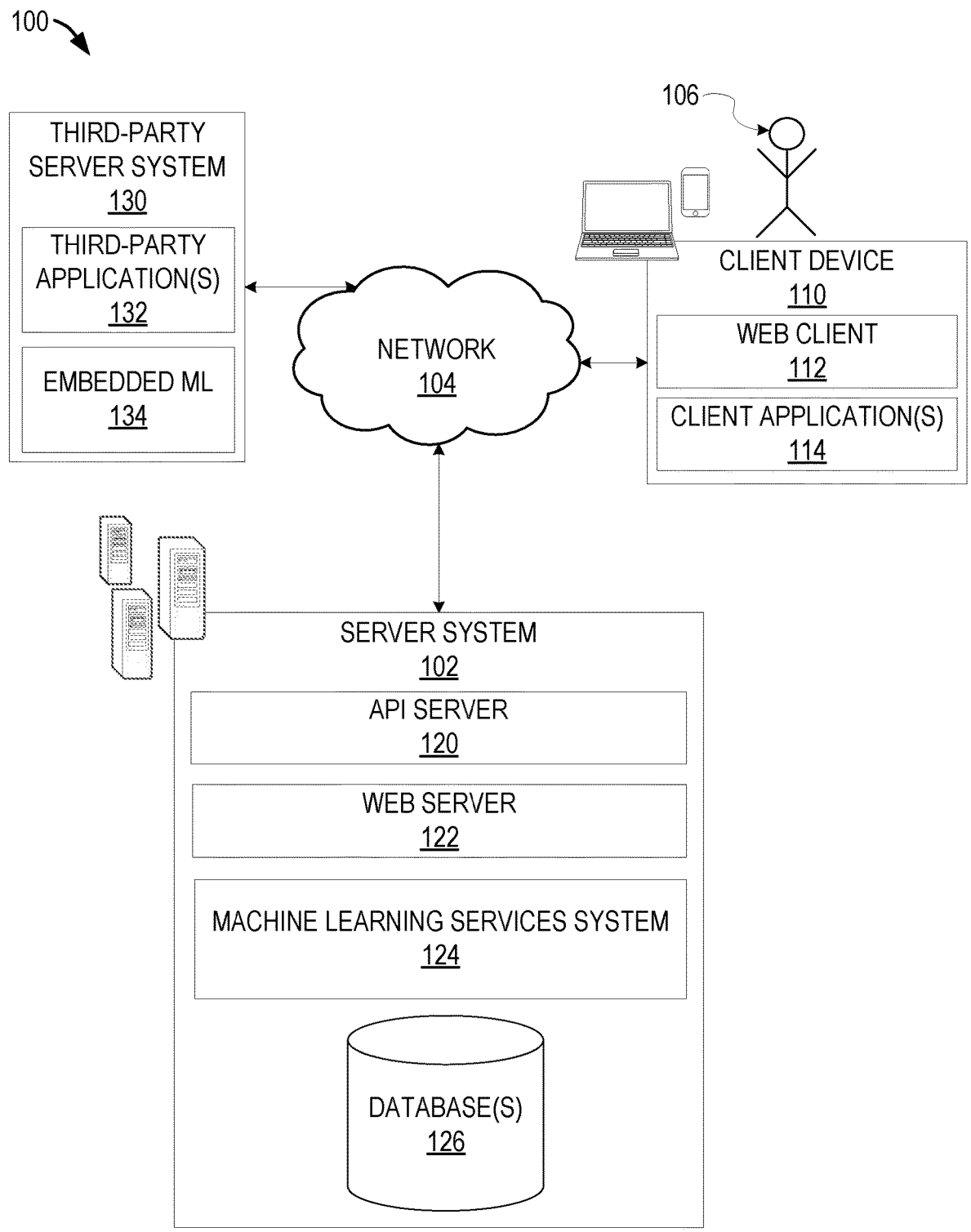
FIG. 1 is a block diagram illustrating a networked system, according to some example embodiments.

Systems and methods described herein relate to embedded machine learning. Conventionally, machine learning models are implemented by experts and stored in high end computing systems. These machine learning models are very cryptic and only some experts can consume these models. Accordingly, an end user cannot directly consume a machine learning model if the user is not also an expert. Moreover, since the machine learning models reside in high end systems that are separate from systems used by an end user, the machine learning models are not integrated into business processes. This can cause issues with compliance and security. For example, systems, such as enterprise resource planning (ERP) systems, must be general data protection regulation (GDRP) compliant according to European Union (EU) law for data protection and privacy for individual citizens of the EP and European Economic Area (EEA). There may be issues with such compliance when machine learning models stored on external high-end computing systems are used to access such personal data. For example, since the machine learning models are not integrated into the overall business processes, the machine learning models cannot use existing processes for ensuring compliance, authorization, authentication, and so forth. Moreover, the machine learning models can become outdated and difficult to update without an expert.

To address these technical issues with conventional machine learning models, embodiments described herein provided an embedded machine learning architecture. For instance, specified machine learning models (e.g., algorithms) are embedded directly with entity business processes on the entity computing systems, which provides a number of benefits. For example, all end users can consume the machine learning model directly, without being experts. Also, an embedded machine learning architecture allows an entity to ensure compliance, such as GDPR compliance (e.g., within an ERP system). For example, an entity can manage its own data and ensure that it has consent from a customer to access data using existing processes for such compliance. Moreover, lifecycle management, security, accessibility, and other issues are also solved with embedded machine learning since the machine learning models are directly integrated with the entity business processes.

Further, in one example, the embedded machine learning architecture is implemented within an underlying in-memory database platform (e.g., such as SAP HANA) which increases speed, combines analytical and transactional data, and brings innovation with embedded machine learning capabilities. SAP HANA is used herein as an example in-memory database platform, but it is to be understood that the embedded machine learning architecture can be implemented within other underlying in-memory platforms. The term in-memory platform is used interchangeably herein with in-memory database system and database system stack.

In one example embodiment, specified machine learning models can comprise part of the embedded machine learning model architecture. For instance, use cases such as forecasting, key influencers, and trending can be solved with classic machine learning algorithms like regression, clustering, classification, or time series analysis. Typically, these algorithms require low memory and CPU time. Accordingly, they can be implemented within a database system (e.g., SAP S/4HANA) stack. This embedded machine learning approach adds instant value to a database system with very low total cost of ownership (TCO) and total cost of development (TCD). SAP S/4HANA is used herein as an example database system stack, but is to be understood that embedded machine learning models can be implemented within other database system stacks.

FIG. 1 is a block diagram illustrating a networked system 100, according to some example embodiments. The system 100 may include one or more client devices such as client device 110. The client device 110 may comprise, but is not limited to, a mobile phone, desktop computer, laptop, portable digital assistants (PDA), smart phone, tablet, ultrabook, netbook, laptop, multi-processor system, microprocessor-based or programmable consumer electronic, game console, set-top box, computer in a vehicle, or any other computing or communication device that a user may utilize to access the networked system 100. In some embodiments, the client device 110 may comprise a display module (not shown) to display information (e.g., in the form of user interfaces). In further embodiments, the client device 110 may comprise one or more of touch screens, accelerometers, gyroscopes, cameras, microphones, global positioning system (GPS) devices, and so forth. The client device 110 may be a device of a user 106 that is used to access and utilize cloud services, among other applications.

One or more users 106 may be a person, a machine, or other means of interacting with the client device 110. In example embodiments, the user 106 may not be part of the system 100 but may interact with the system 100 via the client device 110 or other means. For instance, the user 106 may provide input (e.g., touch screen input or alphanumeric input) to the client device 110 and the input may be communicated to other entities in the system 100 (e.g., third-party servers 130, server system 102) via the network 104. In this instance, the other entities in the system 100, in response to receiving the input from the user 106, may communicate information to the client device 110 via the network 104 to be presented to the user 106. In this way, the user 106 may interact with the various entities in the system 100 using the client device 110.

The system 100 may further include a network 104. One or more portions of network 104 may be an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the public switched telephone network (PSTN), a cellular telephone network, a wireless network, a WiFi network, a WiMax network, another type of network, or a combination of two or more such networks.

The client device 110 may access the various data and applications provided by other entities in the system 100 via web client 112 (e.g., a browser, such as the Internet Explorer® browser developed by Microsoft® Corporation of Redmond, Wash. State) or one or more client applications 114. The client device 110 may include one or more client applications 114 (also referred to as "apps") such as, but not limited to, a web browser, a search engine, a messaging application, an electronic mail (email) application, an e-commerce site application, a mapping or location application, an enterprise resource planning (ERP) application, a customer relationship management (CRM) application, a sales order creation application, and the like.

In some embodiments, one or more client applications 114 may be included in a given client device 110, and configured to locally provide the user interface and at least some of the functionalities, with the client application(s) 114 configured to communicate with other entities in the system 100 (e.g., third-party server system 130, server system 102, etc.), on an as-needed basis, for data and/or processing capabilities not locally available (e.g., access location information, access software version information, access an ERP system, access a CRM system, access machine learning models, to authenticate a user 106, to verify a method of payment, access test data, and so forth). Conversely, one or more applications 114 may not be included in the client device 110, and then the client device 110 may use its web browser to access the one or more applications hosted on other entities in the system 100 (e.g., third-party servers 130, server system 102).

A server system 102 may provide server-side functionality via the network 104 (e.g., the Internet or wide area network (WAN)) to one or more third-party servers 130 and/or one or more client devices 110. The server system 102 may include an application program interface (API) server 120, a web server 122, and a machine learning services system 124 that may be communicatively coupled with one or more databases 126.

The one or more databases 126 may be storage devices that store data related to users of the system 100, applications associated with the system 100, cloud services, machine learning models, and so forth. The one or more databases 126 may further store information related to third-party servers 130, third-party applications 132, client devices 110, client applications 114, users 106, and so forth. In one example, the one or more databases 126 may be cloud-based storage.

The server system 102 may be a cloud computing environment, according to some example embodiments. The server system 102, and any servers associated with the server system 102, may be associated with a cloud-based application, in one example embodiment.

The machine learning services system 124 may provide back-end support for third-party applications 132 and client applications 114, which may include cloud-based applications. The machine learning services system 124 may comprise machine learning business services and machine learning technical services, as described in further detail below. The machine learning services system 124 may comprise one or more servers or other computing devices or systems.

The system 100 further includes one or more third-party server system 130. The one or more third-party server system 130 may include one or more third-party application(s) 132 and one or more embedded machine learning (ML) 134 models. The one or more third-party application(s) 132, executing on third-party server(s) 130, may interact with the server system 102 via API server 120 via a programmatic interface provided by the API server 120. For example, one or more of the third-party applications 132 may request and utilize information from the server system 102 via the API server 120 to support one or more features or functions on a website hosted by the third party or an application hosted by the third party.

The third-party web site or application 132, for example, may provide access to embedded ML 134 and corresponding functionality and data supported by third-party server system 130. In one example embodiment, the third-party website or application 132 may provide access to machine learning models and corresponding functionality that is supported by relevant functionality and data in the third-party server system 130.

In one example, a third-party server system 130 is a system associated with an entity that accesses cloud services via server system 102. In this example, one or more third-party applications 130 are cloud-services application and can access embedded ML 134 models, as explained further below.

Figure 2:
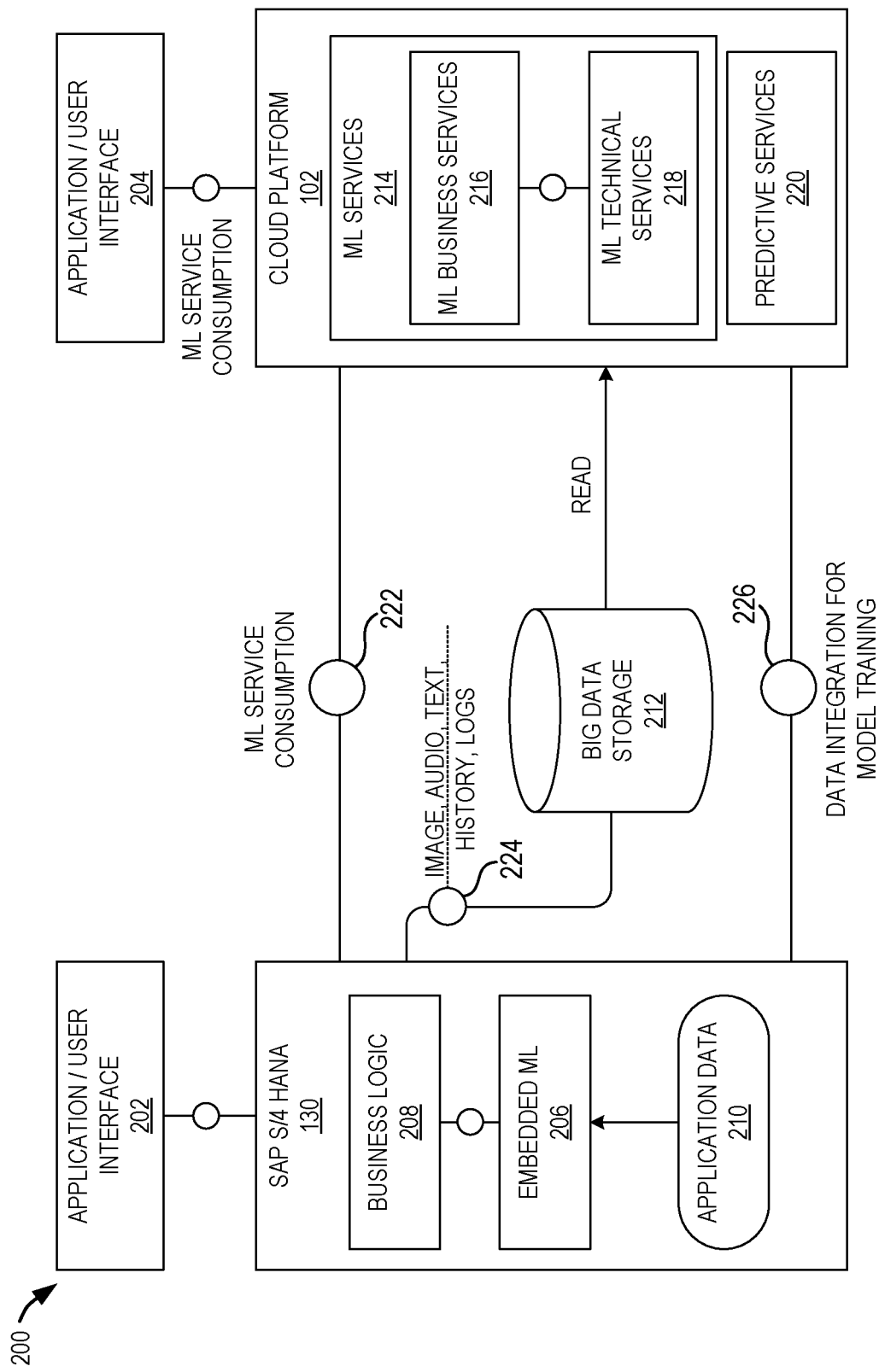
FIGS. 2-5 are block diagrams illustrating embedded machine learning systems, according to some example embodiments.

FIG. 2 is a block diagram 200 illustrating further detail of the third-party server system 130 and server system 102 (also referred to herein as a cloud platform server system 102). The block diagram 200 illustrates at a high level how embedded ML 206 is integrated into a third-party server system 130, according to example embodiments. In one example, the third-party server system 130 is an enterprise resource planning (ERP) system, such as SAP S/4HANA (used as a non-limiting example herein). The third-party server system 130 comprises an in-memory database (e.g., SAP HANA) in some example embodiments. The third-party server system 130 further comprises business logic 208 and application data 210. An application or user interface 202 can be used to access the third-party server system 130.

As explained above, use cases like forecasting, key influencers, and trending can be solved with classic algorithms like regression, clustering, classification, or time series analysis. Usually those algorithms are not resource intensive in terms of memory consumption and CPU time. Thus, in example embodiments, they can be implemented within a third-party system 130 stack (e.g., as embedded ML 206)

where the application data 210 for model training and the machine learning consuming business processes (e.g., business logic 208 comprising processes and applications that utilize output from machine learning models) are located. This embedded ML architecture has very low TCO and TCD. For example, it is much cheaper to implement such uses cases and corresponding machine learning models in the third-party server system 130 stack. Moreover, it is much faster since each of these specific models (or algorithms) can be trained on top of application data 210 and consumed via business logic 208 all within the same system.

Criteria for embedded ML 206 comprise determining the amount of system resource consumption, the type of machine learning algorithms, and whether external data is needed. For example, if a certain type of algorithm (e.g., regression) does not take a lot of system resources (e.g., can be trained in less than five minutes) and does not need to access external data, it would be a good candidate to be selected for embedding in the third-party server system 130.

As described below, in one example embodiment, the embedded ML architecture can utilize a predictive analytics library (PAL) and an automated predictive library (APL) to access the algorithms for each machine learning model of the embedded machine learning models. These two libraries are very fast and can be implemented directly in the database (e.g., SAP S/4 HANA 130).

One example use case that can be included in embedded ML 206 is a conversation user interface (UI) for natural language interaction with an ERP or other system. This is a self-learning solution using machine learning functionality to gain knowledge based on historic data and experience. Also, machine learning can require additional visualization capabilities on the user interface, such as for illustrating confidence intervals or forecasting charts. Thus, embedded ML capabilities can be used in user interfaces. Moreover, robotic process automation can be used to increase a degree of automation.

Use cases like image recognition, sentimental analysis or natural language processing, on the other hand, require deep learning algorithms based on neural networks. For model training, usually these kinds of algorithms demand huge volume of data and GPU time. Therefore, these kinds of scenarios are scaled out to the cloud platform server system 102 (e.g., cloud platform) to keep the load in the transactional third-party server system 130 low. Moreover, the requested data, such as images, audio, text documents, historical data, or application logs, are typically not stored in a third-party server system 130 but instead are typically stored on a big solution, such as big data storage 212. Generally, the consumption of a trained model in a cloud platform such as cloud platform server system 102 are based on remote interfaces. For mass processing, however, these interfaces are bulk enabled or local deployment of inference models are provided.

Accordingly, the cloud platform server system 102 comprises ML services 214 that includes complex use cases that utilize such deep learning algorithms. To consume such machine learning models on a third-party server system 130, all the resources of such a system would be consumed by some neural network algorithm. Thus, all the transaction processes (e.g., ERP processes) or most of them would not work because there would be insufficient memory and CPU time available to do the operations tasks. Accordingly, these complex use cases are not embedded in the third-party server system 130.

The ML services 214 comprises ML business services 216 and ML technical services 218. The server system 102 further comprises predictive services 220. An application or user interface 204 can be used to access the server system 102.

The block diagram 200 further includes an ML service consumption link 222 between the third-party server system 130 and the server system 102, a link 224 for business logic 208 to access big data storage 212 and the cloud platform server system 102, and a data integration for model training link 226.

Figure 3:
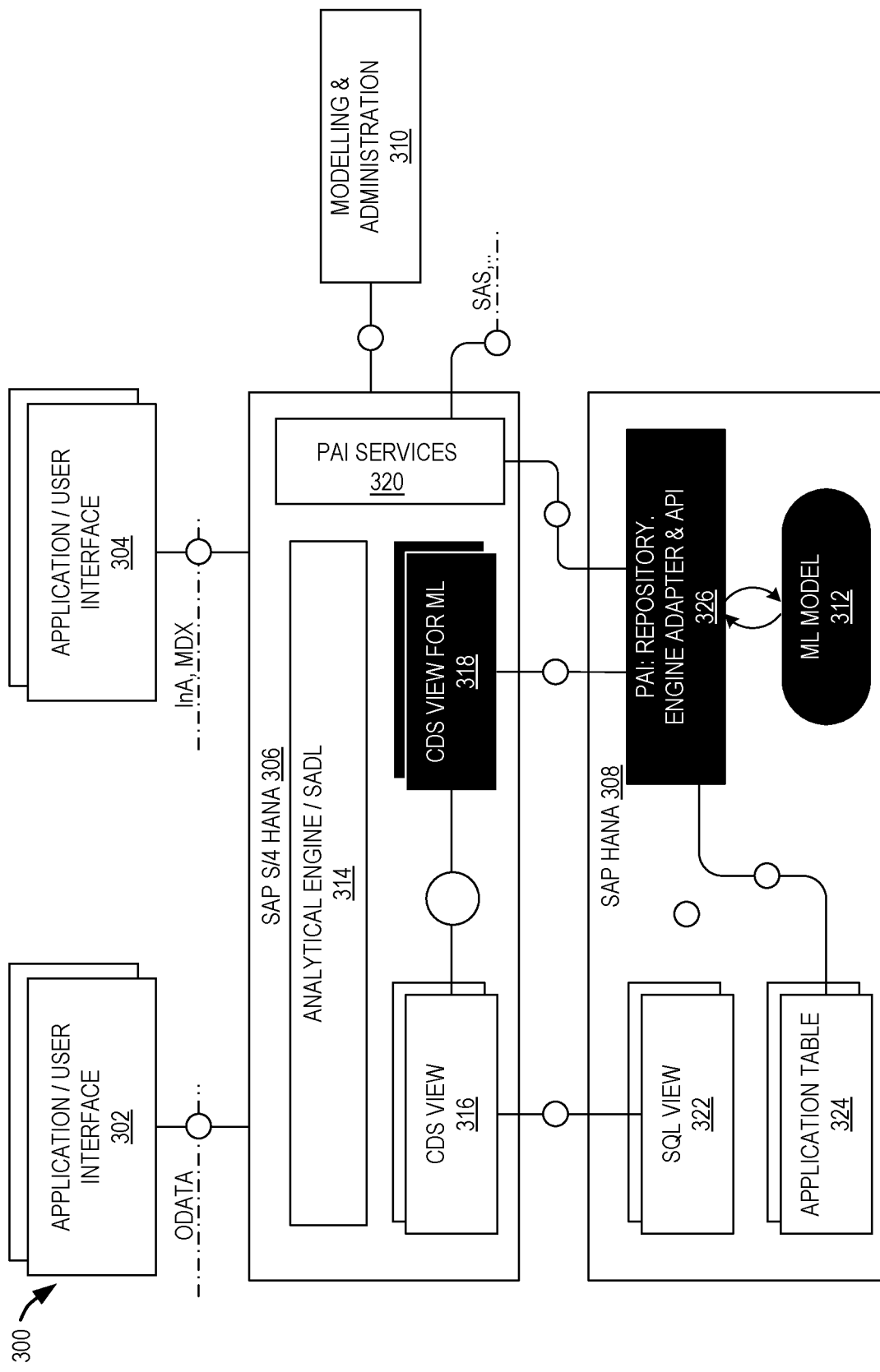

FIG. 3 illustrates an architecture 300 for embedded ML 206, according to some example embodiments. The architecture 300 is based on two main architecture decisions: using a sematic layer (e.g., CDS views) and making use of machine learning techniques provided by a database system (e.g., SAP HANA). For exemplary purposes, this example embodiment will be described with respect to using core data service (CDS) views making use of machine learning techniques provided by SAP HANA. Using this example, the third-party server system 130 comprises SAP S/4HANA 306 and SAP HANA 308. A plurality of application or user interfaces (e.g., 302 and 304) can be used to access the third-party server system 130 via SAP S/4HANA 306 (e.g., to request data from the system). Moreover, a modelling and administration interface 310 can be used to access the third-party server system 130 via SAP S/4HANA to train machine learning models and generate trained machine learning models (e.g., ML model 312).

In this example embodiment, SAP S/4HANA 306 is an ERP system. The SAP S/4HANA 306 comprises an analytical engine or SADL 314, CDS views 316, CDS views for ML 318, and predictive analytics integrator (PAI) services 320. SAP HANA 308 is an in-memory, column-oriented, relational database management system developed by SAP SE. The primary function of SAP HANA 308 is as a database server is to store and retrieve data as requested by applications. SAP HANA 308 comprises SQL views 322, application tables 324, a PAI: repository, engine adapter, and API 326, and machine learning models 312. These components are described in further detail below.

Data persistency in SAP S/4HANA 306 is represented by application database tables. On top of these tables a virtual data model (VDM) is implemented using CDS views 316. One purpose of these VDM views is to hide the cryptic database model and to provide a reusable semantic layer which can be consumed in different scenarios, e.g. analytics, planning, search, or transactions. At runtime, the CDS views 316 are consumed via the analytical engine or SADL 314, which is part of an advanced business application programming (ABAP) application server. ABAP is used to describe example embodiments, it is to be understood that other programming languages can be utilized in example embodiments (e.g., Java). Those frameworks evaluate the metadata of the CDS views 316 in terms of annotations to enable the required functionality for the business process, e.g. hierarchy handling or analytics capabilities. Out of the ABAP CDS views 316 the corresponding SAP HANA SQL views 322 are generated so that SQL operations can be pushed down to SAP HANA 308 for optimal performance.

The algorithms for embedded ML can be performance-intensive as high volumes of application data are processed. Thus, for performance optimization the machine learning algorithms should be processed close to application data. SAP HANA 308 provides predictive analysis library (PAL) and automated predictive library (APL) application function libraries that offer statistical and data mining machine learning algorithms. It is to be understood that PAL and APL are examples of libraries and that other libraries can be used in example embodiments. In addition, specific machine learning algorithms can be implemented if needed. As shown in the FIG. 3, these machine learning algorithms are invoked and orchestrated by the components PAI: repository, engine adapter, and API 326, and modelling and administration 310, which are explained below. The machine learning algorithms use application data (e.g., from application tables 324) as input for machine learning model training. The virtual data model (VDM) with its SQL views 322 and the application tables 324 can be reused for this purpose. However, in contrast to the ABAP CDS views, not all metadata are available. This drawback can be avoided, once the ABAP CDS views are transformed to HANA CDS views.

The trained machine learning models 312 are exposed to business processes by wrapping them with CDS views (e.g., CDS views for ML 318). The details of this integration are described below. The CDS views for ML 318 can be combined with other VDM CDS views 316 and can then be exposed to consumers (e.g., via application or user interface 302 or 304). By consuming ML models 312 through CDS views (e.g., CDS views for ML 318), existing content (e.g. VDM views) and concepts (e.g. authorization, extensibility, or UI integration) are reused. This results in a simple and very powerful solution architecture.

The purpose of predictive analytics integrator (PAI) 326 is to provide a common interface for the consumption of ML models 312, independent of the underlying predictive engine. The intention is to harmonize the management of ML models 312 and to provide a simple common interface to allow applications to interact with different types of supported ML libraries without the requirement for applications to develop ML-engine-specific code. Consumer applications interface only with APIs and do not interact with low level ML libraries.

PAI 326 contains information regarding the installed SAP HANA 308 libraries. It provides a repository for ML models 312 that includes, for example, information concerning model types (e.g. regression, classification or time-series), model data sources (e.g. tables or views), model training data, or model quality figures to allow assessing metrics and support model comparison. PAI 326 may also provide a pluggable infrastructure and adapters for automated (e.g. APL) and expert (e.g. PAL, R or EML) libraries. Models created with SAP Predictive Analytics (automated or expert mode) can be imported into the PAI repository and executed.

Besides hiding the complexity of ML libraries from application development, PAI 326 supports the lifecycle management of the involved artifacts in terms of transport within the system landscape, delivery, and upgrade mechanisms. Furthermore, it provides configuration capabilities for model training based on the customer data in their development landscape. However, breakouts (e.g., coding own algorithms), registering them to PAI 326 for model training and management, and integrating them in ABAP are currently missing and are thus provided by example embodiments.

In one example embodiment, a CDS view 316 is used to train a machine learning model 312. For example, a CDS view 316 is defined to identify or describe which attributes or application information columns are to be used to train a machine learning model (e.g., for a sales order, forecast, or inquiry about a customer). The CDS view 316 is activated to get the SQL view 322 to train the machine learning model (e.g., a linear regression algorithm). The SQL view 322 can access one or more application tables 324 to obtain the data to train the machine learning model. Once the machine learning model is trained, it is stored as an ML model 312 and wrapped with a CDS view for ML 318. The ML model 312 can then be consumed via the CDS view for ML 318 which accesses the ML model 312 via an API (e.g., the PAI: repository, engine adapter, and API 326). The API inputs data required for the ML model 312, receives the output of the ML model 312, and returns the output to the CDS view for ML 318. The output can be made available via an application or user interface 302 or 304.

Figure 4:
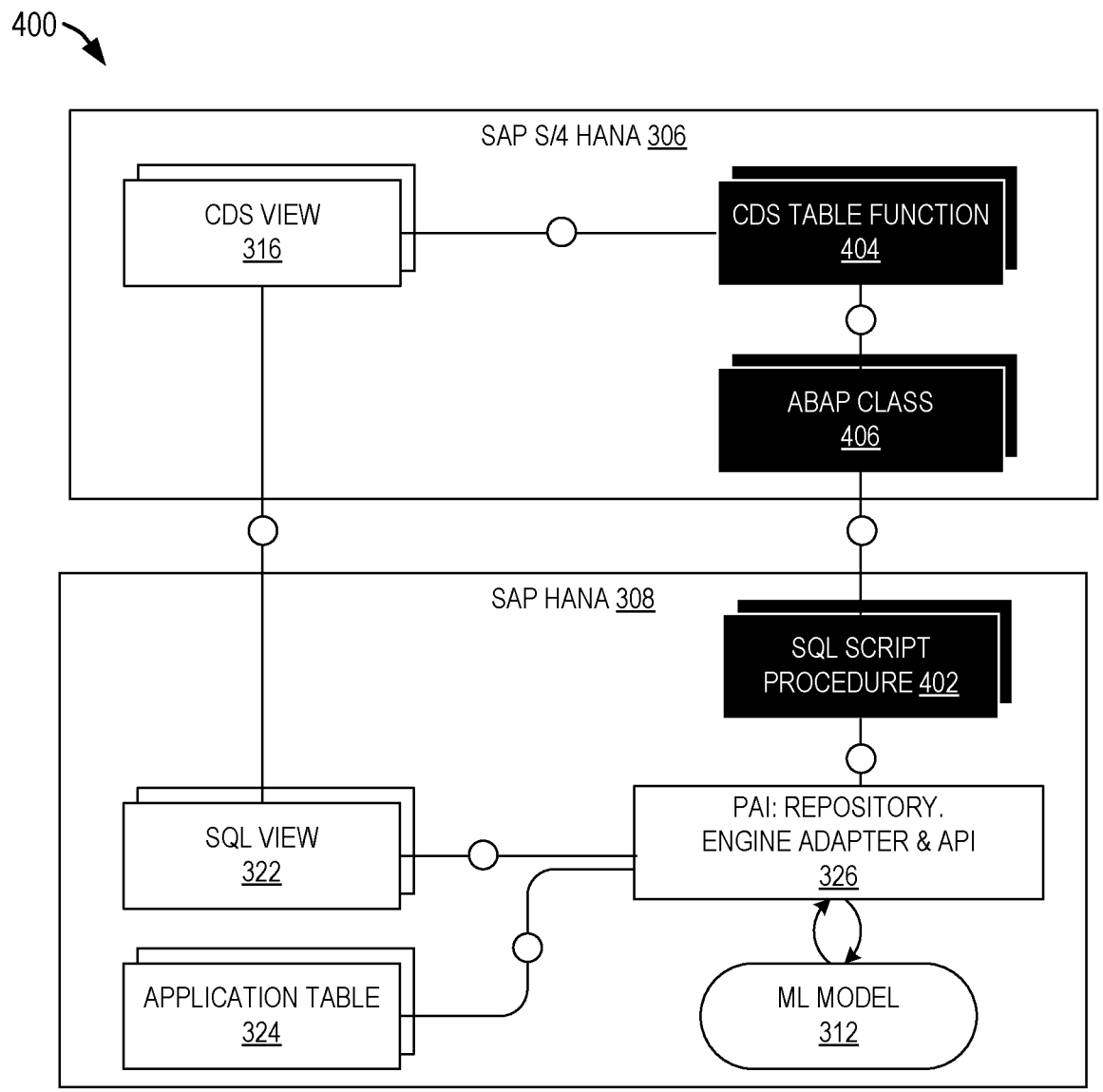

FIG. 4 is a block diagram 400 illustrating further detail of embedded ML 206 in a third-party server system 130. In particular, the block diagram 400 illustrates further details of embedded ML 206 components in SAP S/4HANA 306 and SAP HANA 308.

In the example embodiment shown in FIG. 4, the ML models 312 are stored in SAP HANA 308 and exposed by generated SQL Script procedures 402 or scripted calculation views. Those SAP HANA entities are consumed from an ABAP application server. Various techniques are provided by the ABAP application server to access the underlying database system. As mentioned above, existing content and concepts are reused wherever possible. Therefore, CDS views and respectively CDS table functions 404 corresponding to the CDS views for ML 318 are the technology used to consume the ML models 312 stored in SAP HANA 308.

In one example embodiment, SQL Script procedures 402 are used to wrap the ML models 312 on the SAP HANA 308 level. Those SQL Script procedures 402 are not invoked by standard CDS technology but are instead invoked by CDS table functions 404. These are used for breakout scenarios (e.g., using machine learning algorithms other than those provided in APL, as explained below). They are data dictionary objects and defined via data definition language (DDL) sources, but in contrast to CDS views they are not database-independent but represent native SQL script functions. These functions are implemented using the techniques of ABAP-managed database procedures (AMDP), e.g., via ABAP with an implementation in SQL script.

In one example, SQL script coding for APL is generated by the PAI framework described herein, and the SQL script coding for PAL can be provided by a developer (e.g., a developer associated with a third-party system.

On top of the ML models 312 exposed via SQL script procedures 402, corresponding CDS views for ML 318 are defined by using CDS table function 404 technology. The CDS table function 404 represents the input and output structure of the SQL script procedure 402 that is called by the ABAP AMDP implementation (e.g., ABAP class 406) of the CDS table function 404. The provided CDS view 316, respectively CDS table function 404, can be combined with other VDM views and consumed accordingly. For this purpose, ODATA services can be generated automatically and existing CDS annotations can be used.

As explained above with respect to FIG. 3, a CDS view 316 is used to train a machine learning model and the trained machine learning model is stored as an ML model 312 which is then consumed via a corresponding CDS view for ML 318. Using the example and details shown in FIG. 4, the CDS table function 404 defines the structure of the CDS view for ML 318. For example, the CDS table function 404 defines the attributes (e.g., product ID, months, revenue prediction) for the CDS view. The ABAP class 406 fills in the fields for each attribute with content. For example, if one of the attributes (e.g., revenue prediction) corresponds to a ML model 312, the ABAP class 406 calls the SQL script procedure 402 to access the machine learning model 312 to calculate and output the data for the attribute (e.g., revenue prediction). The output from the machine learning model 312 is received by the SQL script procedure 402 and sends it back to the CDS view for ML 318. The CDS view calculates or reads the output and causes it to be displayed via an application/user interface (e.g., via analytical engine/ SADL 314 and application/user interface 302 or 304).

Figure 5:
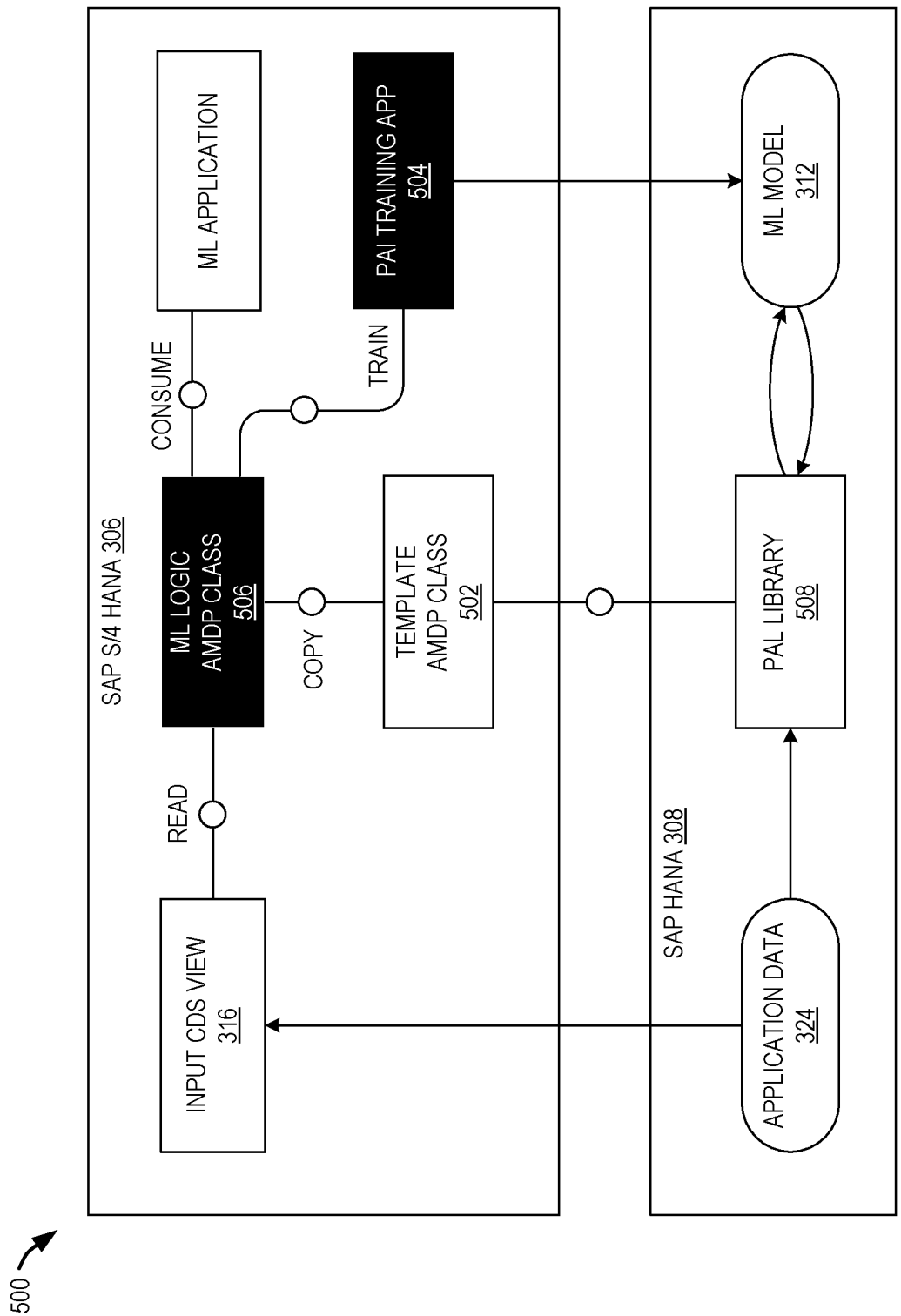

SAP HANA ML library automated predictive library (APL) has built-in data science steps like feature engineering or detection of adequate algorithms. Therefore, this library is very easy to use and results in very low TCO and TCD. For example, the CDS view for ML 318 can be generated automatically. The machine learning algorithms, however, are restricted to just a few machine learning models, such as classification/regression, clustering, time series analysis, and recommendation models of the APL library. Thus, for breakout scenarios in terms of using other machine learning algorithms or fine tuning the models, SAP HANA ML library predictive analytics library (PAL) is used which provides more machine learning algorithms (e.g., more than ninety). FIG. 5 is a block diagram illustrating how the PAL library 508 is integrated for embedded ML 206.

For development efficiency for each PAL algorithm in the PAL library 508, a corresponding template ABAP AMDP class 502 is implemented which has a pre-defined interface consisting of, for example, a train method and a consume method. In one example, a template is provided for each algorithm provided in the PAL library 508 (e.g., decision tree, ransom forest). For extensibility, business add-ins (BADI) enhancement points are provided for those methods. An example template 502 is shown in FIG. 6 as an ABAP class template 600 for a data structure definition, FIG. 7 is a template 700 including a training method 702 and a consumption method 704, and FIG. 8 is a template 800 for implementation. As an example, the templates shown in FIGS. 6-8 are templates for the PAL algorithms random decision trees (RDS). Application developers can copy and adopt those templates for the specific ML scenario to code the logic for training and the logic for consumption. For example, following objects can be copied and adopted (e.g., see coding sections in the templates in FIGS. 6-8 marked with "<<<<<<<TODO:"):
1. Class CL_HEMI_TEMPLATE_RDT
2. Interface for BAdi: IF_HEMI_TEMPLATE_BADI_RDT
3. Enhancement Spot ES_HEMI_TEMPLATE_RDT
4. Fallback Classes CL_HEMI_TEMPLATE_FLBK_RDT and CL_HEMI_TEMPLATE_FLBK2_RDT Accordingly, CDS views 316 as input for model training are defined. Consumption and integration of the ML models into the business processes is based on the corresponding method of the ABAP AMDP class 506. Concrete ML model instances are available once the customers trigger training using the PAI training app 504.

Figure 9:
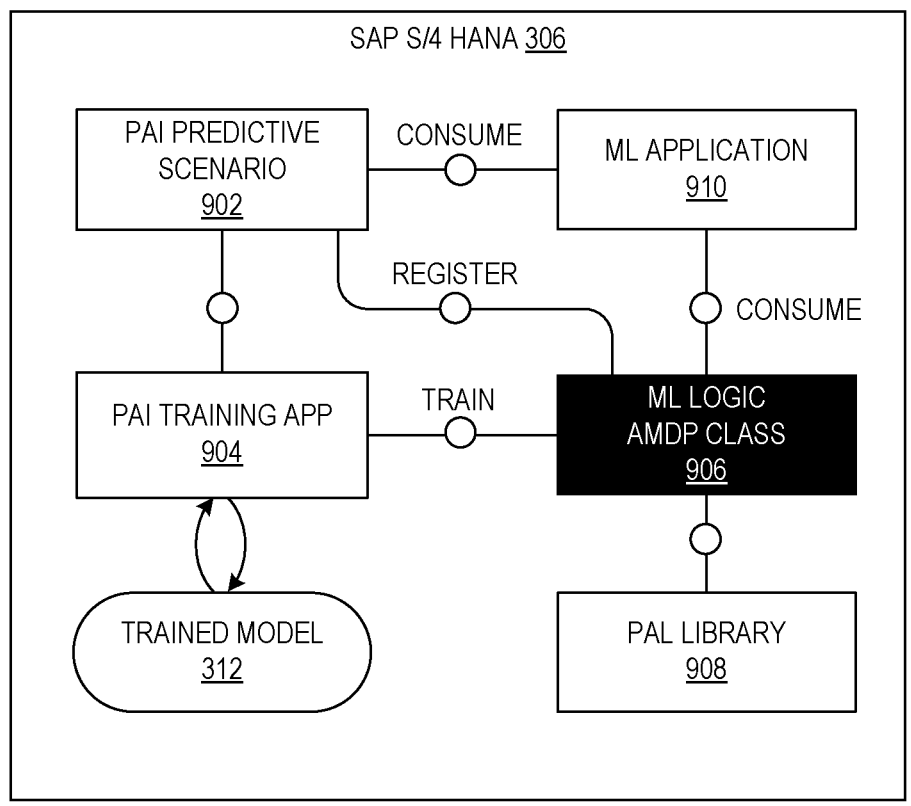
FIG. 9 is a block diagram illustrating an embedded machine learning system, according to some example embodiments.

Lifecycle management and ABAP integration of PAL models are also based on PAI as depicted in FIG. 9. As mentioned above, PAL algorithms are integrated via AMDP technology from SAP HANA into ABAP. The ABAP AMDP class implements interface with train and consume methods. PAI predictive scenario 902 is also created for the PAL based scenarios. Predictive scenario 902 is a business application specific ML design time artifact which includes metadata regarding application data source (e.g. table or view) for training, algorithm type (e.g. regression or classification) and consumption API. The AMDP class 906 for the PAL algorithms (e.g., in PAL library 908) is registered into according predictive scenario 902. As the PAI training app 904 is based on predictive scenario 902, it triggers the training method of the AMDP class 906 and saves the trained model 312. ML applications 910 can consume the trained model 312 via the AMDP class 906 or via API of the predictive scenario 902.

Figure 10:
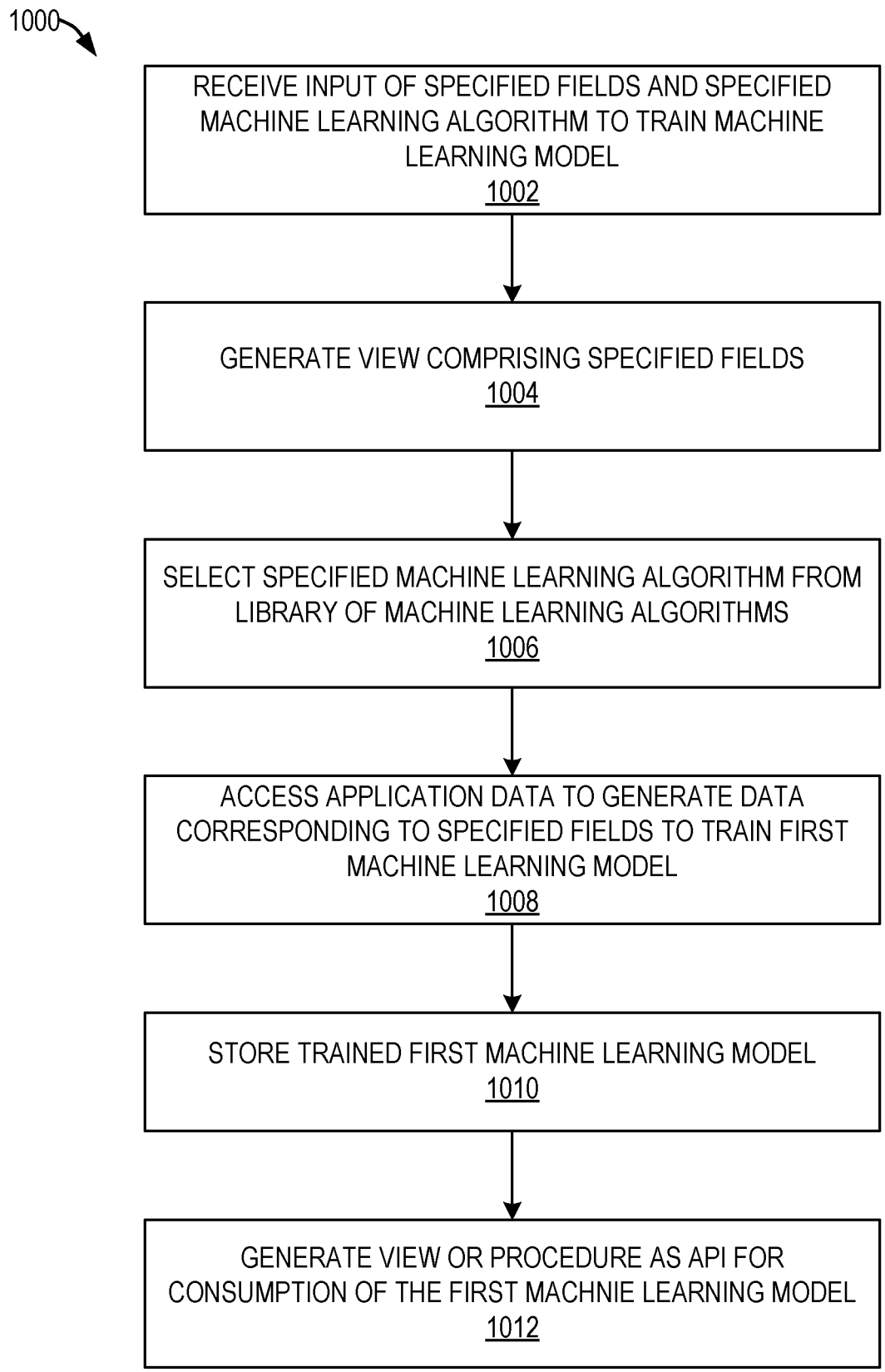
FIG. 10 is a flow chart illustrating aspects of a method for training machine learning models in an embedded machine learning system, according to some example embodiments.

FIG. 10 is a flow chart illustrating aspects of a method 1000 for training a machine learning model using embedded ML architecture, according to some example embodiments. For illustrative purposes, method 1000 is described with respect to the block diagrams of FIGS. 2-4. It is to be understood that method 1000 may be practiced with other system configurations in other embodiments.

In operation 1002, a computing system (e.g., third-party server system 130 or via embedded ML 134) receives, from a computing device (e.g., client device 110), input of specified fields and a specified machine learning algorithm to train a first machine learning model. For example, an entity may wish to provide functionality to its users to forecast revenue for a specified product, as one example use case. In order to provide this functionality, the entity can use a machine learning model to learn from existing sales order data and predict future revenue for a specified product. A user (e.g., a data scientist) associated with the entity can determine which fields (e.g., of sales information data) are relevant for such a use case and which machine learning algorithm is to be used. The user enters this information (e.g., via an application or user interface 202, 302, 304 or modelling and administration 310 interface) and the computing system receives the information.

In operation 1004, the computing system generates a view comprising the specified fields. In one example embodiment, the computing system generates a CDS view 318 comprising the specified fields. This CDS view 318 is then used for training the corresponding machine learning model. The CDS view 318 can also be used for re-training and activation or deactivation of the corresponding machine learning model, and so forth.

In operation 1006, the computing system selects the specified machine learning algorithm (e.g., linear regression) from a library of machine learning algorithms. For example, the computing system selects the specified machine learning algorithm from a PAL library 508 or an APL library, as described above.

In operation 1008, the computing system accesses application data to generate data corresponding to the specified fields to train the first machine learning model using the specified machine learning algorithm. For example, the computing system accesses application data or tables 324 and puts this data to the machine learning algorithm to train the first machine learning model.

Once the first machine learning model is trained, the computing system stores the first machine learning model, in operation 1010. For example, after training is complete, the computing system stores the first machine learning model as an ML model 312.

In operation 1012, the computing system generates a view or procedure as an API for consumption of the first machine learning model. In one example, the computing system generates a CDS view for ML 318 for the first machine learning model, as described above. For instance, the CDS view for ML 318 can be used for machine learning models based on machine learning algorithms in the APL library.

In another example, the computing system generates a SQL script procedure 402 and corresponding CDS table function 404 and ABAP class 406, as also described above. For instance, the SQL script procedure 402 and corresponding CDS table function 404 and ABAP class 406 can be generated and used for breakout scenarios such as machine learning models based on machine learning algorithms in the PAL library. These components can be generated based on templates (e.g., templates 600-800 of FIGS. 6-8), as also described above.

The generated CD view for ML 318 or SQL script procedure 402 and corresponding CDS table function 404 and ABAP class 406 can then be used to consume the trained first machine learning model.

Figure 11:
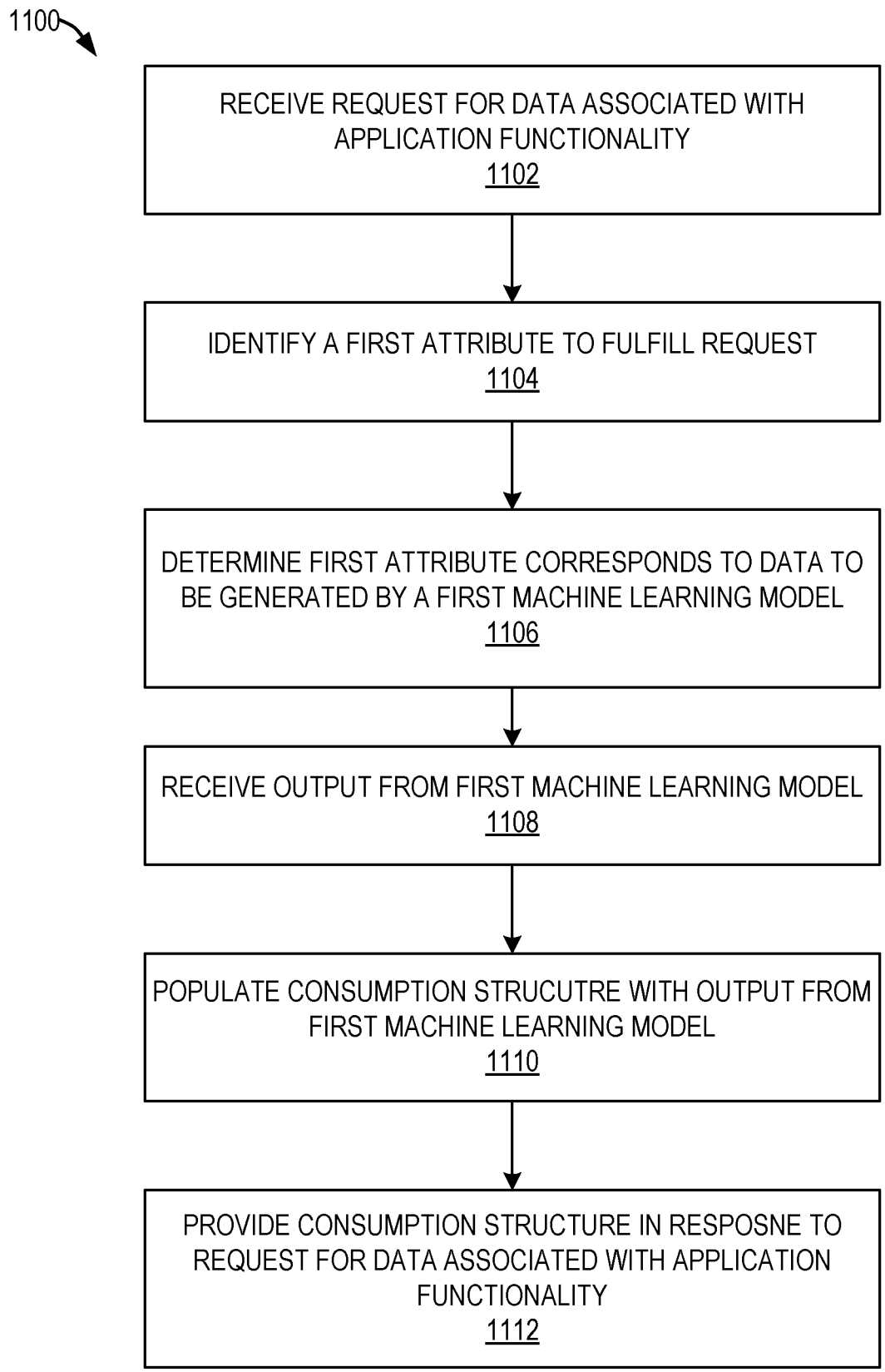
FIG. 11 is a flow chart illustrating aspects of a method for consuming a machine learning model in an embedded machine learning system, according to some example embodiments.

FIG. 11 is a flow chart illustrating aspects of a method 1100 for consuming a trained machine learning model using embedded ML architecture, according to some example embodiments. For illustrative purposes, method 1100 is described with respect to the block diagrams of FIGS. 2-4. It is to be understood that method 1100 may be practiced with other system configurations in other embodiments.

In operation 1102, the computing system receives a request from a computing device for data associated with a particular functionality of an application. For example, a user may request a revenue forecast for an electronics product for the next few months and existing sales order information for the electronics product. The user may enter the information for the request (e.g., product identifier, dates) into an application user interface (e.g., application/user interface 202, 302, or 304) of a computing device (e.g., client device 110). The computing system receives the request, including the specified information, from the computing device.

In operation 1104, the computing system identifies a first attribute for which data is to be generated to fulfill the request. For example, the first attribute is revenue forecast data, using the example above.

In one example embodiment, there may be more than one attribute in a request. Using the example above, the request is for both a revenue forecast and existing sales order information. Accordingly, the computing system identifies each attribute of the request for which data is to be generated to fulfill the request. In this example, the computing system identifies a second attribute corresponding to the existing sales order information.

The computing system defines a consumption structure comprising the identified attributes associated with the requested data. Using the example above, the computing system defines a consumption structure comprising the first attribute (revenue forecast) and the second attribute (existing sales order information). It is to be understood that a request and corresponding consumption structure can comprise more or less attributes than are used in this example.

In one example embodiment, the consumption structure is defined using a CDS view for ML 318 that comprises fields associated with data corresponding to the identified attributes, as described above with respect to FIG. 3. In another example embodiment, the consumption structure is defined using a CDS table function 404 that comprises fields associated with data corresponding to the identified attributes, as described above with respect to FIG. 4.

In operation 1106, the computing system determines that the first attribute corresponds to data to be generated by a first machine learning model (e.g., that has been previously trained using the method 1000 described above with respect to FIG. 10). In one example embodiment, this is determined via the CDS view for ML 318. In another example embodiment, this is determined via the CDS table function 404.

The computing system executes a view or a procedure to generate the input to the first machine learning model. In one example embodiment, the computing system executes the CDS view for ML 318 to generate data for input to the first machine learning model, as shown in FIG. 3. For example, the CDS view for ML 318 defines what data is needed to input to the first machine learning model, and accesses one or more data stores (e.g., application data 210, application data or tables 324) to generate the data. The computing system inputs the generated data into the first machine learning model (e.g., ML model 312) via an API (e.g., PAI: repository, engine adapter, and API 326) and receives the output (e.g., prediction) from the first machine learning model.

In another example embodiment, the computing system executes a CDS table function 404 as shown in 404 to initiate generating data for input to the first machine learning model. For example, the CDS table function 404 defines what data (e.g., attributes) is needed to fulfill the request, and then accesses the ABAP class 406 to populate the data to fulfill the request. If the first machine learning model is needed to generate all or some of the data to fulfill the request (e.g., for the revenue forecast), then the ABAP class 406 generates the data needed to input to the first machine learning model (e.g., by accessing one or more data stores, such as application data 210, application data or tables 324, as described above) and calls the SQL script procedure 402 to access the first machine learning model (e.g., ML model 312). Thus, in this example, the SQL script procedure 402 is the API to access the first machine learning model. The SQL script procedure 402 inputs the generated data into the first machine learning model (e.g., ML model 312) and receives the output (e.g., prediction) from the first machine learning model. In one example embodiment, since the SQL script procedure 402 is the API to access the ML model 312, the SQL script procedure 402 links directly to the ML model 312 and does not need to go through the PAI: repository, engine adapter, and API 326. The SQL script procedure 402 returns the output to the ABAP class 406 and CDS function table 404.

In operation 1108, the computing system receives the output from the first machine learning model. For example, the computing system receives the output from the first machine learning model via the CDS view for ML 318 or CDS table function 404, as explained above. The computing device populates one or more fields associated with the first attribute (e.g., revenue forecast) of the consumption structure with the output from the first machine learning model, in operation 1110.

In operation 1112, the computing system provides the consumption structure in response to the request for data associated with the particular functionality of the application. The consumption structure or data corresponding to the consumption structure is used to generate a display, in a user interface, of the output from the machine learning model corresponding to the first attribute.

For example, the data requested (e.g., as encompassed in the consumption structure) is provided to an application/user interface 202, 302, or 304 to be displayed to a user. In one example, the data request is provided to the application/user interface 202, 302, or 304 via the analytical engine/SADL 314.

In the example described above, a first machine learning model is used to generate data for a revenue forecast for a particular product. The request may include a request for data that requires data from more than one machine learning model and/or generate data from application data or tables. For example, the computing system identifies a second attribute corresponding to the existing sales order information, as explained above. In this case the computing device does not need to access a machine learning model to generate data for the existing sales order information portion of the request, but instead can generate the data for the existing sales order information from one or more data stores, such as application data or tables 210 or 324. Thus, the computing device can generate data (e.g., via a CDS view 316 or ABAP class 406) to populate one or more fields associated with the second attribute of the consumption structure by accessing data from one or more databases. The consumption structure can then be used to generate a display, in a user interface, of the data from the one or more databases corresponding to the second attribute and the output from the trained machine learning model corresponding to the first attribute. For example, the CDS view for the data corresponding to the second attribute and the CDS view for ML 318 corresponding to the first attribute can be consolidated and returned to the requesting computing device.

As explained above, a semantic layer (e.g., CDS view) is used to translate a request from a user into attributes needed to pass to the machine learning model. For example, for each machine learning model, one training CDS view and one consumption CDS view can be provided. This comprises a technical transformation to a cryptical structure of a machine learning model since the semantic layer is in human understandable terminology. If the machine learning model was exposed directly, it would be very cryptic and would not be understandable. Further, example embodiments can take advantage of metadata to incorporate existing framework for accessibility, GDPR, authorization, and so forth. Also, there is a great performance improvement since the machine learning models are embedded in the same system as the application data.

A number of qualities are provided by the embedded ML architecture described herein. For example, the embedded ML architecture provides a seamless integration into a programming model such as the SAP S/4HANA programming model. Also, concepts and components of a system are reused. For example, the embedded ML architecture provides for reuse of existing SAP S/4HANA concepts (e.g., authorization, UI integration), CDS view content and tools, and so forth. The embedded ML architecture provides for powerful extensibility based on enhancement points and BADIs from the start due to reuse of a transactional programming model.

Moreover, the embedded ML architecture provides a rich set of PAL algorithms, SAP HANA TA and R integration analog. The embedded ML architecture supports break-outs per definition (e.g., orchestration of multiple algorithms or data transformations, LM and Operations with SAP S/4HANA ABAP tools and concepts, GDPR compliance by design (e.g., no data transfer), and OP and Cloud deployment is ensured (e.g., one code line approach).

Figure 12:
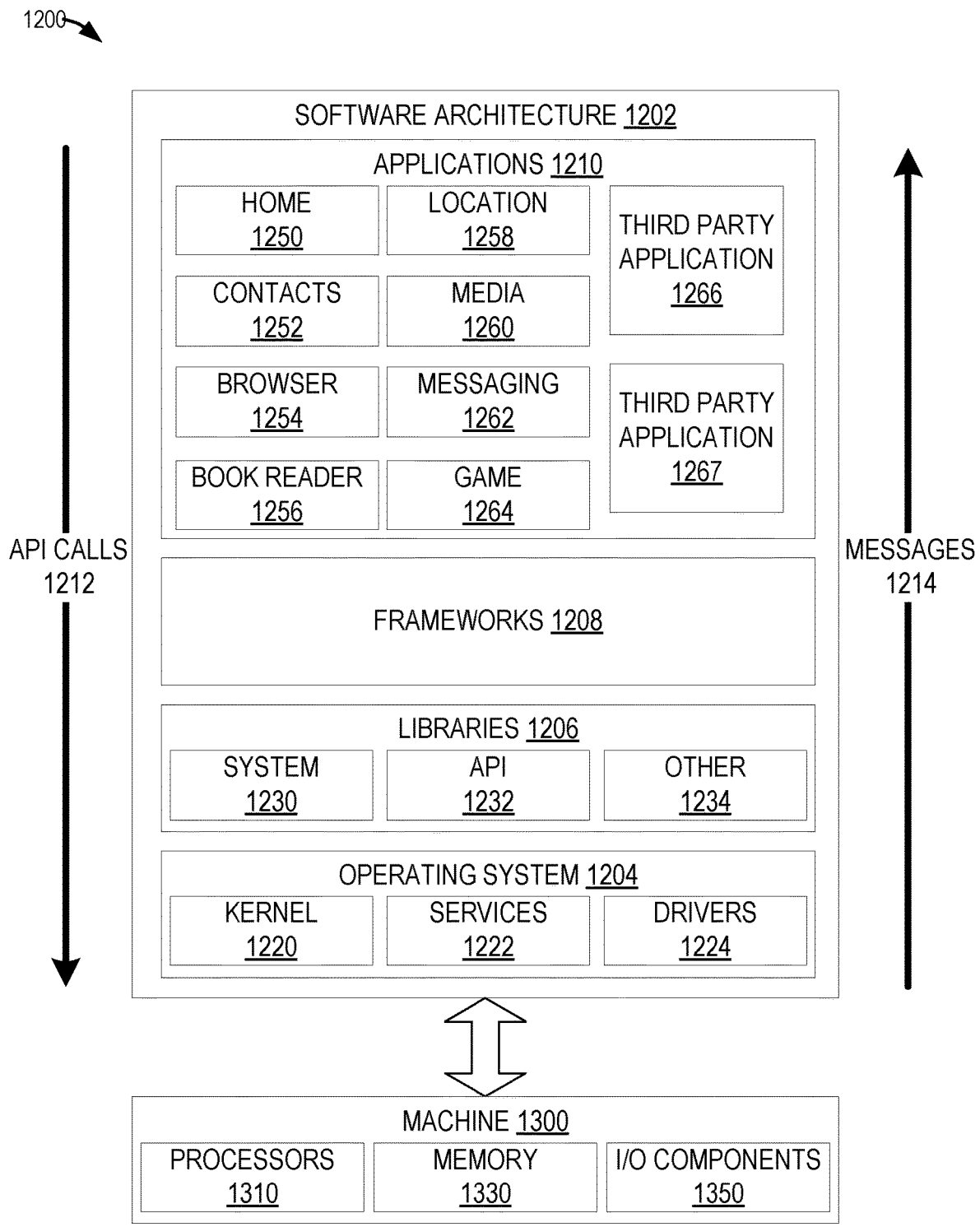
FIG. 12 is a block diagram illustrating an example of a software architecture that may be installed on a machine, according to some example embodiments.

FIG. 12 is a block diagram 1200 illustrating software architecture 1202, which can be installed on any one or more of the devices described above. For example, in various embodiments, client devices 110 and servers and systems 130, 102, 120, 122, and 124 may be implemented using some or all of the elements of software architecture 1202. FIG. 12 is merely a non-limiting example of a software architecture, and it will be appreciated that many other architectures can be implemented to facilitate the functionality described herein. In various embodiments, the software architecture 1202 is implemented by hardware such as machine 1300 of FIG. 13 that includes processors 1310, memory 1330, and I/O components 1350. In this example, the software architecture 1202 can be conceptualized as a stack of layers where each layer may provide a particular functionality. For example, the software architecture 1202 includes layers such as an operating system 1204, libraries 1206, frameworks 1208, and applications 1210. Operationally, the applications 1210 invoke application programming interface (API) calls 1212 through the software stack and receive messages 1214 in response to the API calls 1212, consistent with some embodiments.

In various implementations, the operating system 1204 manages hardware resources and provides common services. The operating system 1204 includes, for example, a kernel 1220, services 1222, and drivers 1224. The kernel 1220 acts as an abstraction layer between the hardware and the other software layers, consistent with some embodiments. For example, the kernel 1220 provides memory management, processor management (e.g., scheduling), component management, networking, and security settings, among other functionality. The services 1222 can provide other common services for the other software layers. The drivers 1224 are responsible for controlling or interfacing with the underlying hardware, according to some embodiments. For instance, the drivers 1224 can include display drivers, camera drivers, BLUETOOTH® or BLUETOOTH® Low Energy drivers, flash memory drivers, serial communication drivers (e.g., Universal Serial Bus (USB) drivers), WI-FI® drivers, audio drivers, power management drivers, and so forth.

In some embodiments, the libraries 1206 provide a low-level common infrastructure utilized by the applications 1210. The libraries 1206 can include system libraries 1230 (e.g., C standard library) that can provide functions such as memory allocation functions, string manipulation functions, mathematic functions, and the like. In addition, the libraries 1206 can include API libraries 1232 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and in three dimensions (3D) graphic content on a display), database libraries (e.g., SQLite to provide various relational database functions), web libraries (e.g., WebKit to provide web browsing functionality), and the like. The libraries 1206 can also include a wide variety of other libraries 1234 to provide many other APIs to the applications 1210.

The frameworks 1208 provide a high-level common infrastructure that can be utilized by the applications 1210, according to some embodiments. For example, the frameworks 1208 provide various graphic user interface (GUI) functions, high-level resource management, high-level location services, and so forth. The frameworks 1208 can provide a broad spectrum of other APIs that can be utilized by the applications 1210, some of which may be specific to a particular operating system 1204 or platform.

In an example embodiment, the applications 1210 include a home application 1250, a contacts application 1252, a browser application 1254, a book reader application 1256, a location application 1258, a media application 1260, a messaging application 1262, a game application 1264, and a broad assortment of other applications such as a third-party applications 1266 and 1267. According to some embodiments, the applications 1210 are programs that execute functions defined in the programs. Various programming languages can be employed to create one or more of the applications 1210, structured in a variety of manners, such as object-oriented programming languages (e.g., Objective- C, Java, or C++) or procedural programming languages (e.g., C or assembly language). In a specific example, the third-party application 1266 (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or another mobile operating system. In this example, the third-party application 1266 can invoke the API calls 1212 provided by the operating system 1204 to facilitate functionality described herein.

Figure 13:
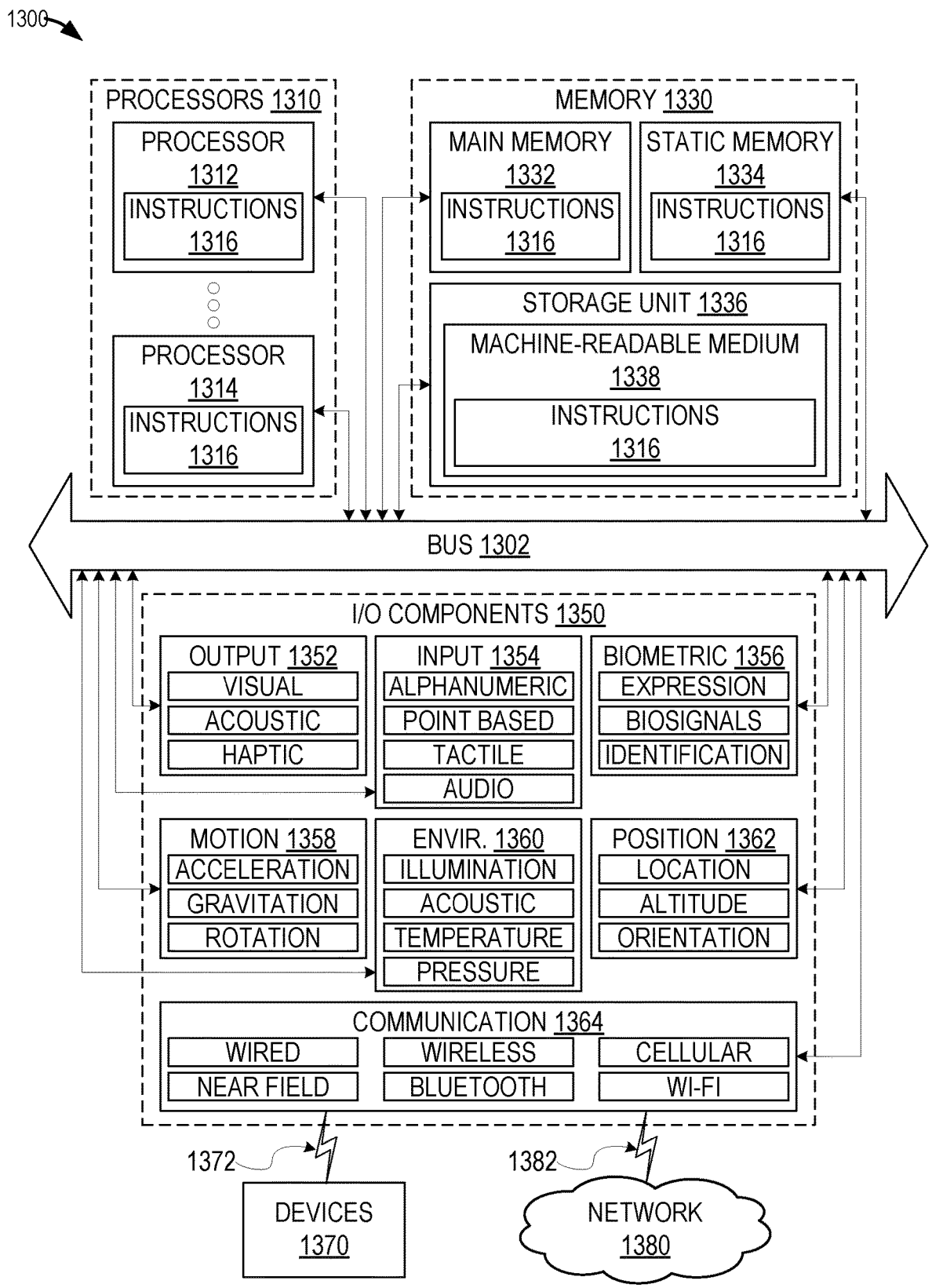
FIG. 13 illustrates a diagrammatic representation of a machine, in the form of a computer system, within which a set of instructions may be executed for causing the machine to perform any one or more of the methodologies discussed herein, according to an example embodiment.

FIG. 13 is a block diagram illustrating components of a machine 1300, according to some embodiments, able to read instructions from a machine-readable medium (e.g., a machine-readable storage medium) and perform any one or more of the methodologies discussed herein. Specifically, FIG. 13 shows a diagrammatic representation of the machine 1300 in the example form of a computer system, within which instructions 1316 (e.g., software, a program, an application 1210, an applet, an app, or other executable code) for causing the machine 1300 to perform any one or more of the methodologies discussed herein can be executed. In alternative embodiments, the machine 1300 operates as a standalone device or can be coupled (e.g., networked) to other machines. In a networked deployment, the machine 1300 may operate in the capacity of a server machine or system 130, 102, 120, 122, 124, etc., or a client device 110 in a server-client network environment, or as a peer machine in a peer-to-peer (or distributed) network environment. The machine 1300 can comprise, but not be limited to, a server computer, a client computer, a personal computer (PC), a tablet computer, a laptop computer, a netbook, a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1316, sequentially or otherwise, that specify actions to be taken by the machine 1300. Further, while only a single machine 1300 is illustrated, the term "machine" shall also be taken to include a collection of machines 1300 that individually or jointly execute the instructions 1316 to perform any one or more of the methodologies discussed herein.

In various embodiments, the machine 1300 comprises processors 1310, memory 1330, and I/O components 1350, which can be configured to communicate with each other via a bus 1302. In an example embodiment, the processors 1310 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) include, for example, a processor 1312 and a processor 1314 that may execute the instructions 1316. The term "processor" is intended to include multi-core processors 1310 that may comprise two or more independent processors 1312, 1314 (also referred to as "cores") that can execute instructions 1316 contemporaneously. Although FIG. 13 shows multiple processors 1310, the machine 1300 may include a single processor 1310 with a single core, a single processor 1310 with multiple cores (e.g., a multi-core processor 1310), multiple processors 1312, 1314 with a single core, multiple processors 1312, 1314 with multiples cores, or any combination thereof.

The memory 1330 comprises a main memory 1332, a static memory 1334, and a storage unit 1336 accessible to the processors 1310 via the bus 1302, according to some embodiments. The storage unit 1336 can include a machine-readable medium 1338 on which are stored the instructions 1316 embodying any one or more of the methodologies or functions described herein. The instructions 1316 can also reside, completely or at least partially, within the main memory 1332, within the static memory 1334, within at least one of the processors 1310 (e.g., within the processor's cache memory), or any suitable combination thereof, during execution thereof by the machine 1300. Accordingly, in various embodiments, the main memory 1332, the static memory 1334, and the processors 1310 are considered machine-readable media 1338.

As used herein, the term "memory" refers to a machine-readable medium 1338 able to store data temporarily or permanently and may be taken to include, but not be limited to, random-access memory (RAM), read-only memory (ROM), buffer memory, flash memory, and cache memory. While the machine-readable medium 1338 is shown, in an example embodiment, to be a single medium, the term "machine-readable medium" should be taken to include a single medium or multiple media (e.g., a centralized or distributed database, or associated caches and servers) able to store the instructions 1316. The term "machine-readable medium" shall also be taken to include any medium, or combination of multiple media, that is capable of storing instructions (e.g., instructions 1316) for execution by a machine (e.g., machine 1300), such that the instructions 1316, when executed by one or more processors of the machine 1300 (e.g., processors 1310), cause the machine 1300 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1350 include a wide variety of components to receive input, provide output, produce output, transmit information, exchange information, capture measurements, and so on. In general, it will be appreciated that the I/O components 1350 can include many other components that are not shown in FIG. 13. The I/O components 1350 are grouped according to functionality merely for simplifying the following discussion, and the grouping is in no way limiting. In various example embodiments, the I/O components 1350 include output components 1352 and input components 1354. The output components 1352 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1354 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some further example embodiments, the I/O components 1350 include biometric components 1356, motion components 1358, environmental components 1360, or position components 1362, among a wide array of other components. For example, the biometric components 1356 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 1358 include acceleration sensor components (e.g., accelerometer), gravitation sensor components, rotation sensor components (e.g., gyroscope), and so forth. The environmental components 1360 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensor components (e.g., machine olfaction detection sensors, gas detection sensors to detect concentrations of hazardous gases for safety or to measure pollutants in the atmosphere), or other components that may provide indications, measurements, or signals corresponding to a surrounding physical environment. The position components 1362 include location sensor components (e.g., a Global Positioning System (GPS) receiver component), altitude sensor components (e.g., altimeters or barometers that detect air pressure from which altitude may be derived), orientation sensor components (e.g., magnetometers), and the like.

Communication can be implemented using a wide variety of technologies. The I/O components 1350 may include communication components 1364 operable to couple the machine 1300 to a network 1380 or devices 1370 via a coupling 1382 and a coupling 1372, respectively. For example, the communication components 1364 include a network interface component or another suitable device to interface with the network 1380. In further examples, communication components 1364 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1370 may be another machine 1300 or any of a wide variety of peripheral devices (e.g., a peripheral device coupled via a Universal Serial Bus (USB)).

Moreover, in some embodiments, the communication components 1364 detect identifiers or include components operable to detect identifiers. For example, the communication components 1364 include radio frequency identification (RFID) tag reader components, NFC smart tag detection components, optical reader components (e.g., an optical sensor to detect one-dimensional bar codes such as a Universal Product Code (UPC) bar code, multi-dimensional bar codes such as a Quick Response (QR) code, Aztec Code, Data Matrix, Dataglyph, MaxiCode, PDF417, Ultra Code, Uniform Commercial Code Reduced Space Symbology (UCC RSS)-2D bar codes, and other optical codes), acoustic detection components (e.g., microphones to identify tagged audio signals), or any suitable combination thereof. In addition, a variety of information can be derived via the communication components 1364, such as location via Internet Protocol (IP) geo-location, location via WI-FI® signal triangulation, location via detecting a BLUETOOTH® or NFC beacon signal that may indicate a particular location, and so forth.

In various example embodiments, one or more portions of the network 1380 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1380 or a portion of the network 1380 may include a wireless or cellular network, and the coupling 1382 may be a Code Division Multiple Access (CDMA) connection, a Global System for Mobile communications (GSM) connection, or another type of cellular or wireless coupling. In this example, the coupling 1382 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

In example embodiments, the instructions 1316 are transmitted or received over the network 1380 using a transmission medium via a network interface device (e.g., a network interface component included in the communication components 1364) and utilizing any one of a number of well-known transfer protocols (e.g., Hypertext Transfer Protocol (HTTP)). Similarly, in other example embodiments, the instructions 1316 are transmitted or received using a transmission medium via the coupling 1372 (e.g., a peer-to-peer coupling) to the devices 1370. The term "transmission medium" shall be taken to include any intangible medium that is capable of storing, encoding, or carrying the instructions 1316 for execution by the machine 1300, and includes digital or analog communications signals or other intangible media to facilitate communication of such software.

Furthermore, the machine-readable medium 1338 is non-transitory (in other words, not having any transitory signals) in that it does not embody a propagating signal. However, labeling the machine-readable medium 1338 "non-transitory" should not be construed to mean that the medium is incapable of movement; the medium 1338 should be considered as being transportable from one physical location to another. Additionally, since the machine-readable medium 1338 is tangible, the medium 1338 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A computer-implemented method comprising:
    receiving, from a computing device via a network, a request for data associated with a particular functionality of an application;
    identifying, by one or more processors of a computing system, a first attribute for which data is to be generated to fulfill the request;
    defining, by one or more processors of a computing system, a consumption structure comprising the first attribute associated with the requested data;
    determining, by the one or more processors of the computing system, that the first attribute corresponds to data to be generated by a first machine learning model;
    executing, by the one or more processors, a view or procedure to generate data for input to the first machine learning model;
    inputting, by the one or more processors, the generated data into the first machine learning model;
    receiving, by the one or more processors, output from the first machine learning model;
    populating one or more fields associated with the first attribute of the consumption structure with the output from the first machine learning model; and
    providing the consumption structure in response to the request for data associated with the particular functionality of the application.

2. The computer-implemented method of claim 1, wherein the consumption structure is used to generate a display, in a user interface, of the output from the first machine learning model corresponding to the first attribute.

3. The computer-implemented method of claim 1, wherein the view is a core data services (CDS) view.

4. The computer-implemented method of claim 1, wherein before receiving the request for data, the method comprises:
    receiving input of specified fields and a specified machine learning model algorithm to train the first machine learning model;
    generating a view comprising the specified fields;
    selecting the specified machine learning algorithm from a library of machine learning model algorithms;
    accessing application data to generate data corresponding to the specified fields to train the first machine learning model using the specified machine learning algorithm;
    storing the first machine learning model after training is complete; and
    generating the view or procedure as an application programming interface for consumption of the first machine learning model.

5. The computer-implemented method of claim 4 wherein the view is a CDS view and the procedure is a SQL script procedure.

6. The computer implemented method of claim 1, further comprising:
    identifying a second attribute for which data is to be generated to fulfill the request;
    wherein defining the consumption structure further comprises defining the consumption structure comprising the first attribute and the second attribute associated with the requested data; and
    generating data to populate one or more fields associated with the second attribute of the consumption structure by accessing corresponding data from one or more databases.

7. The computer-implemented method of claim 6, wherein the consumption structure is used to generate a display, in a user interface, of the data from the one or more databases and the output from the trained machine learning model corresponding to the first attribute and second attribute.

8. The computer-implemented method of claim 1, wherein the procedure is a SQL script procedure.

9. The computer-implemented method of claim 1, wherein the procedure is executed in an in-memory database system and the first machine learning model is stored in the in-memory database system.

10. A system comprising:
    one or more processors of a machine; and
    a hardware storage device storing instructions that, when executed by the one or more processors, causes the one or more processors to perform operations comprising:
    receiving, from a computing device via a network, a request for data associated with a particular functionality of an application;

identifying a first attribute for which data is to be generated to fulfill the request;

defining a consumption structure comprising the first attribute associated with the requested data;

determining that the first attribute corresponds to data to be generated by a first machine learning model;

executing a view or procedure to generate data for input to the first machine learning model;

inputting the generated data into the first machine learning model;

receiving output from the first machine learning model;

populating one or more fields associated with the first attribute of the consumption structure with the output from the first machine learning model; and providing the consumption structure in response to the request for data associated with the particular functionality of the application.

11. The system of claim 10, wherein the consumption structure is used to generate a display, in a user interface, of the output from the first machine learning model corresponding to the first attribute.

12. The system of claim 10, wherein the view is a core data services (CDS) view.

13. The system of claim 10, wherein before receiving the request for data, the operations comprise:

receiving input of specified fields and a specified machine learning model algorithm to train the first machine learning model;

generating a view comprising the specified fields;

selecting the specified machine learning algorithm from a library of machine learning model algorithms;

accessing application data to generate data corresponding to the specified fields to train the first machine learning model using the specified machine learning algorithm;

storing the first machine learning model after training is complete; and generating the view or procedure as an application programming interface for consumption of the first machine learning model.

14. The system of claim 13, wherein the view is a CDS view and the procedure is a SQL script procedure.

15. The system of claim 10, the operations further comprising:

identifying a second attribute for which data is to be generated to fulfill the request;

wherein defining the consumption structure further comprises defining the consumption structure comprising the first attribute and the second attribute associated with the requested data; and generating data to populate one or more fields associated with the second attribute of the consumption structure by accessing corresponding data from one or more databases.

16. The system of claim 15, wherein the consumption structure is used to generate a display, in a user interface, of the data from the one or more databases and the output from the trained machine learning model corresponding to the first attribute and second attribute.

17. The system of claim 10, wherein the procedure is a SQL script procedure.

18. The system of claim 10, wherein the procedure is executed in an in-memory database system and the first machine learning model is stored in the in-memory database system.

19. A non-transitory computer-readable medium comprising instructions stored thereon that are executable by at least one processor to cause a computing device to perform operations comprising:

receiving, from a computing device via a network, a request for data associated with a particular functionality of an application;

identifying a first attribute for which data is to be generated to fulfill the request;

defining a consumption structure comprising the first attribute associated with the requested data;

determining that the first attribute corresponds to data to be generated by a first machine learning model;

executing a view or procedure to generate data for input to the first machine learning model;

inputting the generated data into the first machine learning model;

receiving output from the first machine learning model;

populating one or more fields associated with the first attribute of the consumption structure with the output from the first machine learning model; and providing the consumption structure in response to the request for data associated with the particular functionality of the application.

20. The non-transitory computer-readable medium of claim 19, wherein the consumption structure is used to generate a display, in a user interface, of the output from the trained machine learning model corresponding to the first attribute.

* * * * *